United States Patent [19]

Dong-Il

[11] Patent Number: 4,841,171
[45] Date of Patent: Jun. 20, 1989

[54] HIGH SPEED COMPARATOR CIRCUIT WITH SINGLE SUPPLY VOLTAGE

[75] Inventor: Song Dong-Il, Suwon, Rep. of Korea

[73] Assignee: Samsung Electronics Co., Ltd., Suwon, Rep. of Korea

[21] Appl. No.: 139,734

[22] Filed: Dec. 30, 1987

[51] Int. Cl.$^4$ .............................................. H03K 5/24
[52] U.S. Cl. .................................... 307/355; 307/300; 307/362; 307/491; 307/494
[58] Field of Search ............... 307/355, 362, 300, 491, 307/494

[56] References Cited

U.S. PATENT DOCUMENTS

| | | | |
|---|---|---|---|
| 4,147,944 | 4/1979 | Monticelli | 307/362 |
| 4,406,955 | 9/1983 | LoCascio | 307/362 |
| 4,577,121 | 3/1986 | Sano et al. | 307/355 |

*Primary Examiner*—John Zazworsky
*Attorney, Agent, or Firm*—Robert E. Bushnell

[57] ABSTRACT

An improved high speed comparator having the compatible open collector output in TTL to use the single supply voltage and reduce the non-symmetrical distortion even by using only NPN transistors without using PNP transistors which are taken as the limit element of the high speed. Forward base-emitter voltage of transistor Q6 is matched with base-emitter voltage of transistor Q11, base-emitter voltage of transistor Q5 is matched with base-emitter voltage of transistor Q12, and reverse emitter-collector voltage of transistor Q7 is matched with reverse emitter-collector voltage of transistor Q10. When resistance R1 equals one-half of resistance R2, voltage drop across R2 equals the base-emitter voltage of transistor Q13, and well balanced square waves may be generated by driving transistors Q1, Q2 with a single current source.

21 Claims, 2 Drawing Sheets

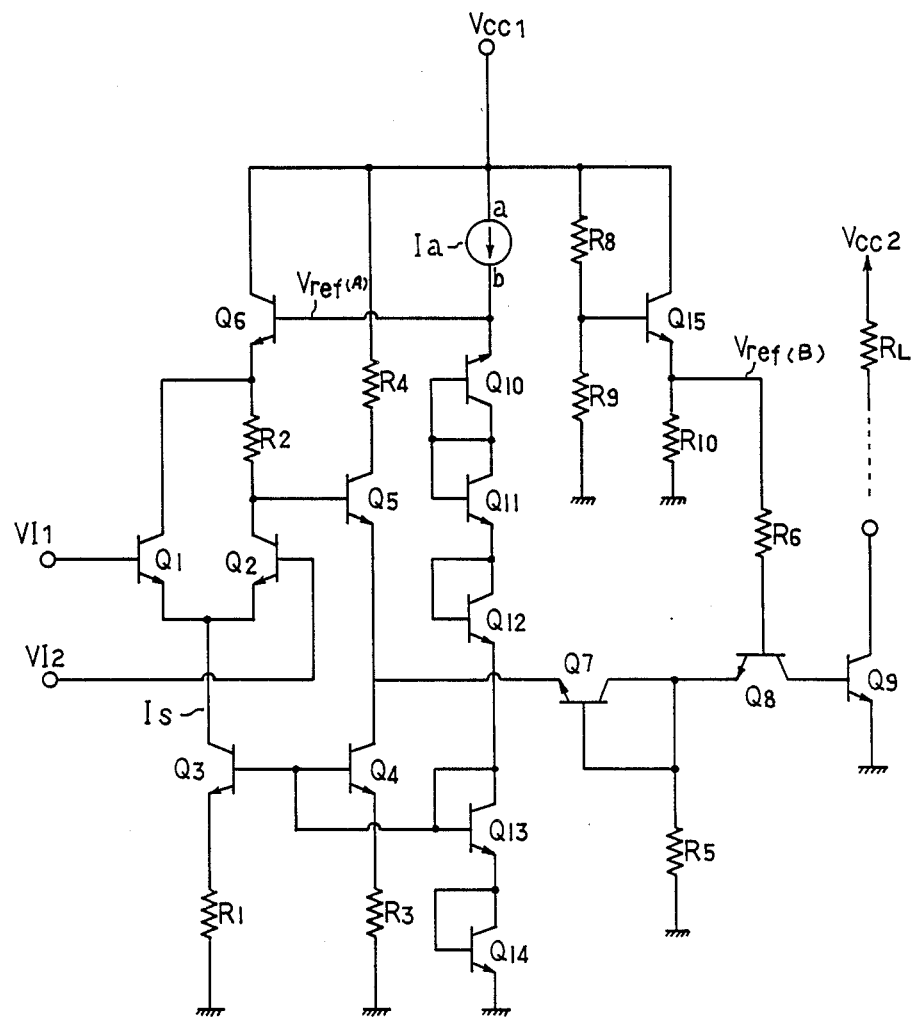
F I G. 2

HIGH SPEED COMPARATOR CIRCUIT WITH SINGLE SUPPLY VOLTAGE

BACKGROUND OF THE INVENTION

The present invention relates in general to a comparator, and more particularly to a high speed comparator circuit having the compatible open collector output in TTL(Transistor-Transistor Logic) using the single supply voltage.

In general monolithic linear IC(integrated circuit), The PNP transistor having the lateral structure becomes the limit element in constituting the high frequency circuit or the high speed comparator due to the inferior frequency characteristics the very low current amplification factor and the large variation of characteristic according to the operating current thereof.

The major conditions in the characteristics of a comparator are as follows: that firstly the non-symmetrical distortion of the output signal according to the amplitude variation of the input signal thereof must be small and the delay time must be constant, namely this means that the balance of rise and fall time and the minimization of delay skew must be accomplished; that secondly the switching speed must be fast; and that thirdly the variation of said first and second characteristics according to the variation of supply voltage must be small.

Meanwhile, the conventional comparator circuit as shown in FIG. 1 was constituted by coupling the NPN transistors Q25, Q26 and Q27 with the PNP transistors Q21, Q22, Q23 and Q24, but it has a defect in which it does not satisfy said three characteristics thereof. Also the high speed comparator of the type that is constituted by only NPN transistors without using PNP transistors is known, but it has many problems of complication thereof due to use of two power supply circuits, namely positive power supply and negative power supply.

SUMMARY OF THE INVENTION

Accordingly, an object of the present invention is to provide an improved high speed comparator circuit. It is another object to provide a high speed comparator circuit in which a single power supply is used and the symmetrical distortion is very small even by using only NPN transistors without using PNP transistors which are taken as the limit element of high speed.

Also, according to an aspect of the present invention, there is provided a high speed comparator circuit having a single power supply characterized in that the foward voltage $V_{BE}$ between the base and the emitter of the transistor Q6 is matched with $V_{BE}$ of the transistor Q11, $V_{BE}$ of the transistor Q5 is matched with the transistor Q12, and the backward voltage $V_{EC}$ between the emitter and the collector of the transistor Q7 is matched with $V_{EC}$ of the transistor Q10, and that, when both inputs of the first and second input terminals VI1 and VI2 are equal to each other, supposing that resistance 2R1 is equal to resistance R2, then the voltage drop of the resistor R2 is equal to $V_{BE}$ and this voltage is matched with the voltage between the base and the emitter of the transistor Q13, whereby balanced square waves are produced according to operation of transistors Q1 and Q2, by single current source, and the switching speed is performed at high speed by transistors Q8 and Q9.

BRIEF DESCRIPTION OF THE DRAWINGS

The invention will become more readily apparent from the following description of a preferred embodiment thereof shown, by way of example only, in the accompanying drawings in which:

FIG. 2 is a circuit diagram of the comparator according to the present invention.

DESCRIPTION OF THE PREFERRED EMBODIMENT

Figure 1:
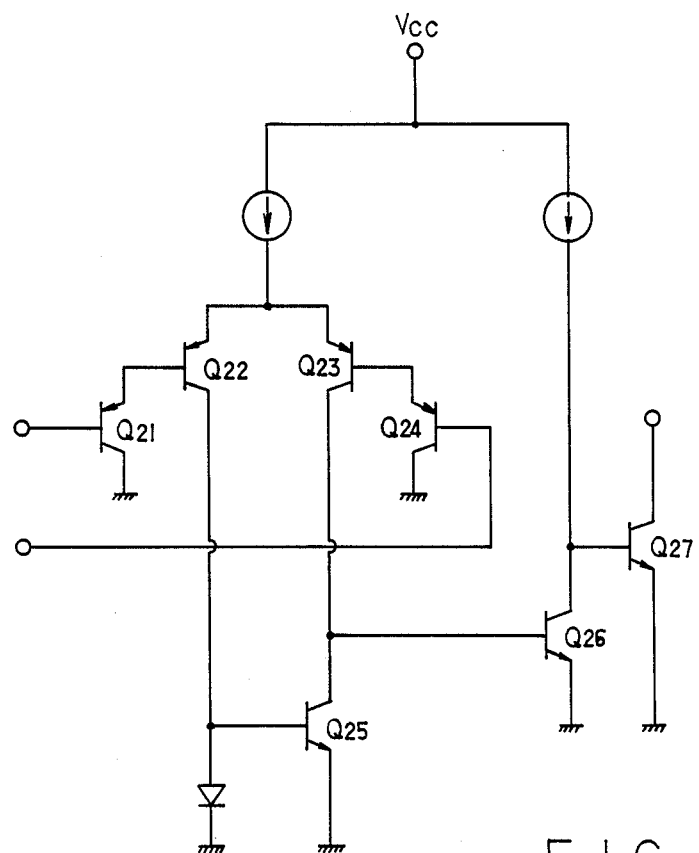
FIG. 1 is a circuit diagram of the conventional comparator.

Now will be explained in detail an example of the present invention by referring to the accompanying drawings.

Referring first to FIG. 2 which shows a comparator circuit according to the present invention, the reference numerals Q1 through Q15 represent a plurality of transistors, the reference numerals R1 through R10 represent resistors, the reference numeral RL represents a load resistance, and the reference numerals VI1, and VI2 represent the first and the second input terminals respectively.

Figure 3:
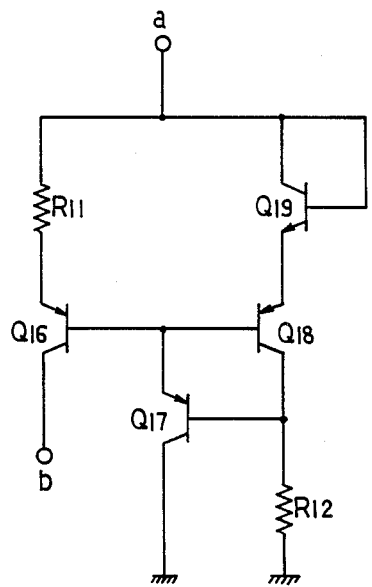
FIG. 3 is a circuit diagram of the current source.

Referring secondly to FIG. 3 which shows the current source circuit according to the present invention and corresponds to said current source Ia shown in FIG. 2, the reference numerals Q16 through Q19 represent a plurality of transistors, the reference numerals R11 and R12 represent resistors, and the terminals a and b are the connection terminals of said current source Ia in FIG. 2.

Returning again to FIG. 2, the forward voltage $V_{BE}$ between the base and the emitter of the transistor Q6 is matched with the voltage $V_{BE}$ of the transistor Q11, the voltage $V_{BE}$ of the transistor Q5 is matched with the voltage $V_{BE}$ of the transistor Q12, and the backward voltage $V_{EC}$ between the emitter and the collector of the transistor Q7 is matched with the voltage $V_{EC}$ between the emitter(E) and the collector (C) of the transistor Q10. Also, when both inputs of the first and the second input terminals are equal to each other (VI1=-VI2), the collector current of the transistor Q2 is half of the collector current I of the transistor Q3 and the voltage drop of the resistor R2 is taken as $$\frac{R2}{2R1} V_{BE}.$$

At this time, supposing that the resistance is $R1 = (\frac{1}{2})R2$, then the voltage drop of the resistor R2 is equal to said voltage $V_{BE}$ and this voltage is matched with the voltage between the base(B) and the emitter(E) of the transistor Q13.

To the first and the second input terminals VI1 and VI2 can be applied signals having the reverse polarity, or said first input terminal VI1 can be fixedly connected with the DC reference voltage and said signal can be applied only to said second input terminal VI2.

If the voltage of said first input VI1, is greater than the voltage of said second input terminal VI2, then the transistor Q1 is turned-on and the transistor Q2 is turned-OFF, and at this time the collector voltage of said transistor Q2 becomes as $(V_{REF}(A) - V_{BE}(ON))$. Also if said voltage of said first input terminal VI1, is smaller than the input voltage of said second input terminal VI2, then said transistor Q1 is turned-off and said transistor Q2 is turned-on, and at this time the collector voltage of said transistor Q2 becomes as $$\left( V_{REF(A)} - V_{BE(ON)} - \frac{R2}{R1} V_{BE} \right).$$

In addition, if both inputs of said first and the second input terminals VI1 and VI2 are equal to each other, then both of said transistors VI1 and VI2 are simultaneously turned-on and said collector voltage of said transistor Q2 becomes as $$\left( V_{REF(A)} - V_{BE(ON)} - \frac{R2}{2R1} V_{BE} \right).$$

At this time, if the magnitude in resistors is taken as (R2=2 R1), then the balanced square waves of 2 $V_{BE}$[Vp-p] are produced to the emitter terminal side of the transistor Q8 and this minimizes the non-symmetrical distortion due to the amplitude of said input signal. On the one hand, if the voltage 2 $V_{BE}$[V] is applied to said emitter terminal of said transistor Q8, then said transistor Q8 is turned-off between the base(B) and the emitter(E) thereof. On the other hand, the current flows through the B-C of said transistor Q8 and the B-E of the transistor Q9 via the resistor R6 to permit said transistor Q9 to go into conduction.

Also, if 0[V] is applied to said emitter terminal of said transistor Q8, then the current flow through the B-E of said transistor Q8 via the resistor R6 and the resistor R5 to lower the base voltage of said transistor Q9 to $V_{BE}$, thereby turning-off said transistor Q9.

At this time, since the carriers stored in said base of said transistor Q9 are removed through the path of the collector-to-emitter of said transistor Q8 and said resistor R5, the switching speed of comparator becomes very fast.

According to the present invention as above-described, there are advantages in which, when the resistance of 1 KΩ is used as the load resistance, the realization of the high speed drive having the rise or fall time below 50 nsec and the minimization of the non-symmetrical distortion of output signal according to variation of input signal amplitude and the delay skew can be performed.

It is further understood by those skilled in the art that the foregoing description is that of one preferred embodiment of the present invention and that various changes and modifications may be in the invention without departing from the spirit and scope thereof.

What is claimed is:

1. A high speed comparator circuit, comprising:
   first and second resistances, said first resistance being connectable to a reference potential;
   first and second semiconductor devices each having emitter electrodes connectable in common to a reference potential via said first resistance, each having a base electrode providing a discrete respective first and second input terminal, said second resistance being coupled to form a first node between a collector electrode of said first semiconductor device and a second node with a collector terminal of said second semiconductor device;
   third and fourth transistors each having a common collector-base junction coupled in common with an emitter electrode of said third transistor coupled to a third node;
   a fifth transistor having a base electrode coupled to said second node, a collector electrode connectable to a common voltage source, and an emitter electrode connectable to said reference potential;
   a sixth transistor having a collector electrode connectable to a common voltage source, an emitter electrode coupled to said first node, a base electrode coupled to said third node, and exhibiting a forward voltage $V_{BE}$ between the base and the emitter electrode of the sixth transistor matched with forward voltage $V_{BE}$ of the fourth transistor;
   a seventh transistor having a collector-base junction connectable to said reference potential, and an emitter electrode coupled to said emitter electrode of said fifth transistor;
   an eighth transistor having a common collector-base junction connected to an emitter electrode of said fourth transistor, the forward voltage $V_{BE}$ of the eighth transistor; and
   a ninth transistor having a common collector-base junction connected to an emitter of said eighth transistor and between said commonly connected emitter electrodes of said first and second transistors and said first resistance and said emitter electrode of said fifth transistor;
   the backward voltage $V_{EC}$ between the emitter and the collector of the seventh transistor being matched with the backward voltage $V_{EC}$ of the third transistor;
   wherein, when both inputs of the first and second input terminals are equal to each other, if the value of said first resistance is equal to one-half of the value of said second resistance, then voltage drop across the second resistance is equal to $V_{BE}$ and this voltage is matched with voltage between the base and the emitter of the ninth transistor,
   whereby well balanced square waves are produced by operation of said first and second transistors by a single current source.

2. The circuit of claim 1, further comprising:
   reference means connectable in common with said collector electrode of said sixth transistor to a common voltage source, for providing a reference voltage;
   a tenth transistor having a base electrode and providing a collector-emitter path connectable between an impedance load and a reference potential; and
   means coupled to receive said second reference voltage and connected to said collector-base junction of said seventh transistor, for removing charge carriers stored in said base electrode of said tenth transistor.

3. The circuit of claim 1, wherein said first, second, third, fourth, fifth, sixth, seventh, eighth and ninth transistors comprise NPN transistors.

4. The circuit of claim 2, wherein said first, second, third, fourth, fifth, sixth, seventh, eighth, ninth and tenth transistors comprise NPN transistors.

5. The circuit of claim 2, further comprised of an impedance load exhibiting a one kilo-ohm resistance coupled to a collector electrode of said tenth transistor.

6. A high speed comparator circuit, comprising:
   first, second, third, fourth and fifth resistances, said first, third and fifth resistances being connectable to a reference potential and said fourth resistance being connectable to a common voltage source;

first and second semiconductor devices each having emitter electrodes coupled in common and connectable to a reference potential via said first resistance, each having a base electrode providing a discrete respective first and second input terminal, said second resistance being coupled to form a first node between a collector electrode of said first semiconductor device and a second node with a collector terminal of said second semiconductor device;

third and fourth semiconductor devices each having a common collector-base junction coupled in common; current source means connectable in common with said fourth resistance to a common voltage source for providing a first reference voltage to a third node at an emitter electrode of said third semiconductor device;

a fifth semiconductor device having a base electrode coupled to said second node, a collector electrode connectable to a common voltage source via said fourth resistance, and an emitter electrode connectable to said reference potential via said third resistance;

a sixth semiconductor device having a collector electrode connectable in common with said fourth resistance to a common voltage source, an emitter electrode coupled to said first node, a base electrode coupled to said third node, and a base-emitter voltage characteristic of said fourth semiconductor device;

a seventh semiconductor having a common collector-base junction connectable to said reference potential via said fifth resistance, an emitter electrode coupled to said emitter electrode of said fifth semiconductor device, and an emitter-collector reverse voltage characteristic matched to an emitter-collector reverse voltage characteristic of said third semiconductor device;

an eighth semiconductor device having a common collector-base junction connected to an emitter electrode of said fourth semiconductor device, and a base-emitter voltage characteristic matched to a base-emitter voltage characteristic of said fifth semiconductor device; and a ninth semiconductor device having a common collector-base junction connected to an emitter of said eighth semiconductor device and between said commonly connected emitter electrodes of said first and second semiconductor devices and said first and third resistances, and an emitter electrode connectable to said reference potential.

7. The circuit of claim 6, further comprising:
reference means connectable in common with said fourth resistance to a common voltage source, for providing a second reference voltage;

a tenth semiconductor device having a base electrode and providing a collector emitter path connectable between an impedance load and a reference potential; and means coupled to receive said second reference voltage and connected to said collector-base junction of said seventh semiconduction device, for removing charge carriers stored in said base electrode of said tenth transistor.

8. The circuit of claim 6, further comprising:
reference means connectable in common with said fourth resistance to a common voltage source, for providing a second reference voltage;

a tenth semiconductor device having a base electrode coupled to receive said second reference voltage, and an emitter electrode coupled to said collector-base junction of said seventh semiconductor device; and an eleventh semiconductor device having a base electrode coupled to a collector electrode of said tenth semiconductor device, and a collector-emitter path connectable between an impedance load and a reference potential.

9. The circuit of claim 6, further comprised of the value of said second resistance being twice the value of said first resistance, and said ninth semiconductor device having a base-emitter voltage characteristic matched with a voltage across said second resistance.

10. The circuit of claim 7, further comprised of the value of said second resistance being twice the value of said first resistance, and said ninth semiconductor device having a base-emitter voltage characteristic matched with a voltage across said second resistance.

11. The circuit of claim 8, further comprised of the value of said second resistance being twice the value of said first resistance, and said ninth semiconductor device having a base-emitter voltage characteristic matched with a voltage across said second resistance.

12. The circuit of claim 6, wherein said first, second, third, fourth, fifth, sixth, seventh, eighth and ninth semiconductor devices comprise NPN transistors.

13. The circuit of claim 7, wherein said first, second, third, fourth, fifth, sixth, seventh, eighth, ninth and tenth semiconductor devices comprise NPN transistors.

14. The circuit of claim 8, wherein said first, second, third, fourth, fifth, sixth, seventh, eighth, ninth, tenth and eleventh semiconductor devices comprise NPN transistors.

15. The circuit of claim 9, wherein said first, second, third, fourth, fifth, sixth, seventh, eighth, and ninth semiconductor devices comprise NPN transistors.

16. The circuit of claim 7, further comprised of an impedance load exhibiting a one kilo-ohm resistance coupled to a collector electrode of said tenth semiconductor device.

17. The circuit of claim 8, further comprised of an impedance load exhibiting a one kilo-ohm resistance coupled to a collector electrode of said eleventh semiconductor device.

18. A high speed comparator circuit, comprising:
first and second semiconductor devices each having first conducting electrodes coupled in common and connectable to a reference potential, and each having control electrodes providing separate respective first and second input terminals, a second conducting electrode of said second semiconductor device being coupled to a second conducting electrode of said first semiconductor device;

third and fourth semiconductor devices each having first conducting electrodes with common second conducting electrode-control electrode connections coupled together;

a fifth semiconductor device having a control electrode coupled to said second conducting electrode of said second semiconductor device, a first conducting electrode connectable to said reference potential, and a second conducting electrode coupled to said common voltage source;

a sixth semiconductor device having a first conducting electrode coupled to said second conducting of said first semiconductor device, a second conducting electrode connectable in common with said second conducting electrode of said fifth semiconductor device to a common voltage source, a control electrode coupled to said first node, and a control-first conducting electrode voltage matched to a control-first conducting electrode voltage of said fourth semiconductor device;

a seventh semiconductor device having a first conducting electrode coupled to said first conducting electrode of said fifth semiconductor device, a common second conducting electrode-control electrode connection connectable to said reference potential, and a first conducting-second conducting electrode reverse voltage characteristic matched to a first conducting-second conducting electrode reverse voltage characteristic of said third semiconductor device;

an eighth semiconductor device having a first conducting electrode a common second conducting electrode-control electrode connection coupled to said first conducting electrode of said fourth semiconductor device, and a control-first conducting electrode voltage matched to a control-first conducting electrode voltage of said fifth semiconductor; device and a ninth semiconductor having a first conducting electrode connectable to said reference potential, a common second conducting electrode-control electrode connection coupled to said first conducting electrode of said eighth semiconductor device and between said commonly connected first conduction electrodes of said first and second semiconductor devices.

19. The circuit of claim 18, further comprising:
first and second impedances,
said first impedance being coupled to said first conducting electrodes of said first and second semiconductor devices for connecting said first and second semiconductor devices to said reference potential,
said second impedance being coupled to form a second node with said second conducting electrode of said first semiconductor device and said first conducting electrode of said sixth semiconductor device and to form a third node with said second conducting node of said second semiconductor device and said control electrode of said fifth semiconductor device,
the value of said second impedance being twice the value of said first impedance, and
said ninth semiconductor device exhibiting a control-first electrode voltage matched with a voltage across said second impedance.

20. The circuit of claim 18, further comprising:
reference means connectable in common with said second conducting electrode of said fifth semiconductor device to said common voltage source, for providing a reference voltage;
a tenth semiconductor device having a control electrode and provide a semiconducting path between first and second conducting electrodes connectable between an impedance load and a reference potential; and
means coupled to receive said second reference voltage and connectable to said common second conducting electrode-control connection of said seventh semiconductor device, for removing charge carriers stored in said control electrode of said tenth semiconductor device.

21. The circuit of claim 19, further comprising:
reference means connectable in common with said second conducting electrode of said fifth semiconductor device to said common voltage source, for providing a reference voltage;
a tenth semiconductor device having a control electrode and provide a semiconducting path between first and second conducting electrodes connectable between an impedance load and a reference potential; and
means coupled to receive said second reference voltage and connectable to said common second conducting electrode-control electrode connection of said seventh semiconductor device, for removing charge carriers stored in said control electrode of said tenth semiconductor device.

* * * * *